United States Patent
Zhao et al.

(10) Patent No.: US 10,228,194 B2
(45) Date of Patent: Mar. 12, 2019

(54) AIRTIGHT STRUCTURE

(71) Applicant: CHAMP TECH OPTICAL (FOSHAN) CORPORATION, Foshan (CN)

(72) Inventors: Xiao-Yu Zhao, Foshan (CN); Chi-Yuan Lai, New Taipei (TW); Meng Fu, Foshan (CN)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 0 days.

(21) Appl. No.: 15/604,806

(22) Filed: May 25, 2017

(65) Prior Publication Data
US 2018/0274866 A1    Sep. 27, 2018

(30) Foreign Application Priority Data
Mar. 27, 2017 (CN) .......................... 2017 1 0186984

(51) Int. Cl.
F28D 15/04 (2006.01)
F28D 15/02 (2006.01)
F28D 21/00 (2006.01)

(52) U.S. Cl.
CPC ..... F28D 15/0275 (2013.01); F28D 15/0233 (2013.01); F28D 15/04 (2013.01); F28D 2021/0028 (2013.01)

(58) Field of Classification Search
CPC .. F28D 15/033; F28D 15/046; F28D 15/0275; H01L 23/427; H01L 23/4006
USPC .............................. 165/80.2, 104.26; 361/700
See application file for complete search history.

(56) References Cited

U.S. PATENT DOCUMENTS

| | | | | |
|---|---|---|---|---|
| 6,082,443 A * | 7/2000 | Yamamoto | .......... | F28D 15/0233 165/104.21 |
| 6,263,959 B1 * | 7/2001 | Ikeda et al. | ......... | F28D 15/0233 165/104.26 |
| 6,650,544 B1 * | 11/2003 | Lai | ........................ | F28D 15/046 165/104.21 |
| 6,874,568 B2 * | 4/2005 | Lai | ...................... | F28D 15/0233 165/104.26 |
| 7,032,652 B2 * | 4/2006 | Wang et al. | ........ | F28D 15/0233 165/104.26 |
| 7,100,679 B2 * | 9/2006 | Dussinger et al. | .......................... | F28D 15/0233 165/104.21 |
| 8,875,779 B2 * | 11/2014 | Lien | ....................... | F28D 15/04 165/104.26 |
| 8,985,197 B2 * | 3/2015 | Wang | .................. | F28D 15/0233 165/104.21 |
| 9,700,930 B2 * | 7/2017 | Yang | ..................... | B21D 53/02 |
| 2010/0077614 A1 | 4/2010 | Hou | | |

* cited by examiner

Primary Examiner — Allen Flanigan
(74) Attorney, Agent, or Firm — ScienBiziP, P.C.

(57) ABSTRACT

An airtight structure includes a first plate, a second plate, a wick structure mounted between the first plate and the second plate. A middle portion of the second plate forms a cup portion. The cup portion and the first plate together define a cavity. The wick structure is received in the cavity. A portion of the first plate extends upwardly to form a first extending portion. The first extending portion is a hollow cylinder. A portion adjacent to an end of the second plate forms a through hole corresponding to the first extending portion. The first extending portion extends through the through hole, an inner surface of the through hole contacts the first extending portion.

11 Claims, 1 Drawing Sheet

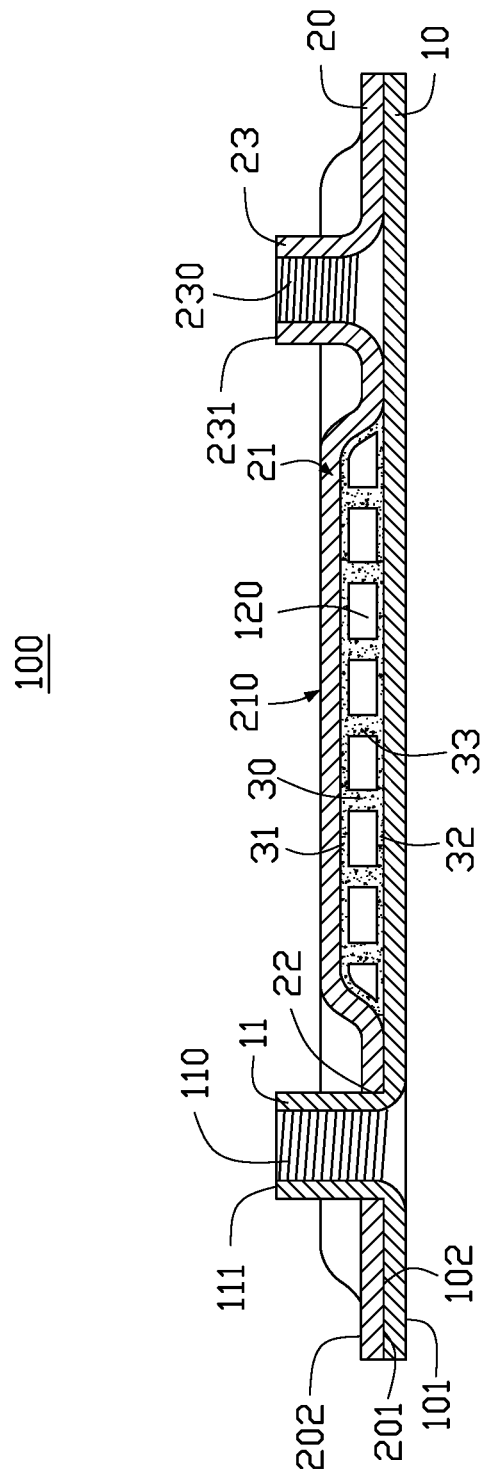

AIRTIGHT STRUCTURE

CROSS-REFERENCE TO RELATED APPLICATIONS

This application claims priority to Chinese Patent Application No. 201710186984.0 filed on Mar. 27, 2017, the contents of which are incorporated by reference herein.

FIELD

The subject matter herein generally relates to a heat dissipation structure, especially, relates to an airtight structure for heat dissipation of a circuit.

BACKGROUND

Generally, an airtight structure is configured on a circuit for heat dissipation.

The airtight structure includes a first plate, a second plate and a wick structure mounted between the first plate and the second plate. The first plate and the second plate have a plurality of through holes for corresponding screws. The crews correspondingly enter the through holes to fix the first plate on the second plate and also make the airtight structure connect with the circuit. However, an additional portion is mounted between the airtight structure and the circuit. The screws connect the airtight structure and the circuit by the additional portion.

Thus, the additional portion decrease stability between the airtight structure and the circuit, further, the screw in the through holes are easily loosened, which impacts the stability between the airtight structure and the circuit.

BRIEF DESCRIPTION OF THE DRAWINGS

Implementations of the present technology will now be described, by way of example only, with reference to the attached FIGURES.

The FIGURE is a cross-sectional view of an airtight structure of the present disclosure.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

An airtight structure 100 of the present disclosure includes a first plate 10, a second plate 20, a wick structure 30 mounted between the first plate 10 and the second plate 20.

The first plate 10 is a level board and has a uniform thickness. The first plate 10 has a first surface 101 and a second surface 102 opposite to the first surface 101. A portion of the first plate 10 extends away from a plane of the leveled first plate 10 to form a first extending portion 11. The first extending portion 11 is perpendicular to the first plate. The first extending portion 11 is formed by stamping in exemplary embodiment.

In the exemplary embodiment, the first extending portion 11 is a hollow cylinder. An inner surface of the first extending portion 11 defines a first screw thread 110.

The second plate 20 is a bonding plate and has a uniform thickness. The second plate 20 is made of the same materials as the first plate 10. The second plate 20 has a bottom surface 201 and a top surface 202 opposite to the bottom surface 201.

The second plate 20 bonds to the first plate 10. A middle portion of the second plate 20 forms a cup portion 21 with the first plate 10. A middle portion of the cup portion 21 is a flat board. A cross-section of the cup portion 21 is substantially a trapezoid. A radius of the cup portion 21 decreases away from the first plate 10. While the second plate 20 is positioned on the first plate 10, the cup portion 21 of the second plate 20 and the first plate 10 together define a cavity 120. The wick structure 30 is received in the cavity 120.

Further, a portion adjacent to an end of the second plate 20 defines a through hole 22 through the bottom surface 201 and the top surface 202. The through hole 22 corresponds to the first extending portion 11 of the first plate 10. The first extending portion 11 extends through the through hole 22. An inner surface of the through hole 22 contacts the first extending portion 11. The first extending portion 11 has a first top end 111. The first top end 111 of the first extending portion 11 is above a bottom surface 210 of the cup portion 21.

A portion adjacent to another end of the second plate 20 extends perpendicularly to the second plate 20 to form a second extending portion 23. The second extending portion 23 and the through hole 22 are formed on opposite sides of the cup portion 21. The second extending portion 23 extends away from the bottom surface 201 by the stamping. The second extending portion 23 has a second top end 231. The second top end 231 of the second extending portion 23 is above the bottom surface 210 of the cup portion 21. The second extending portion 23 is a hollow cylinder. An inner surface of the second extending portion 23 defines a second screw thread 230.

The wick structure 30 is received in the cavity 120. Specifically, the wick structure 30 includes a first portion 31 mounted on the bottom surface 201 corresponding to the cup portion 21, a second portion 32 mounted on the second surface 102 of the first plate 10 and a plurality of third portions 33 connected between the first portion 31 and the second portion 32. The plurality of third portions 33 is perpendicular with the first portion 31 and the second portion 32. Every two adjacent third portions 33 have equal spacing.

The first portion 31 has a same thickness as a thickness of the second portion 32. A cross-section of all the third portions 33 has a rectangular shape. A thickness of the third portion 33 is greater than the thickness of the first portion 31.

While the second plate 20 is welded on the first plate 10, the first extending portion 11 extends through the through hole 22 and beyond the bottom surface of the cup portion 21. The second extending portion 23 is on the first plate. The cup portion 21 and the first plate 10 define a cavity having a tight sealing. The airtight structure 100 couples to a circuit by the first extending portion 21 and the second extending portion 23.

In the present disclosure, the first plate 10 has the first extending portion 11, the second plate 20 has the through hole 22 corresponding to the first extending portion 11 and the second extending portion 23. The first extending portion 11 and the second extending portion 23 are all formed by stamping. While the second plate 20 is welded on the first plate 10, the first extending portion 11 extends through the through hole 22, the second extending portion 23 is on the second surface 102 of the first plate 10. Thus, the airtight structure 100 can connect directly to a circuit rather than by additional elements.

Also, the first extending portion 11 and the second extending portion 23 are formed on opposite sides of the cup portion 21, so the cavity 120 defined by the first plate 10 and cup portion 21 of the second plate 20 has a tight sealing.

The embodiments shown and described above are only examples. Many details are often found in the art such as the other features of an airtight structure. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. An airtight structure, comprising:
 a first plate;
 a second plate;
 a wick structure mounted between the first plate and the second plate;
 wherein a middle portion of the second plate forms a cup portion, the cup portion and the first plate together define a cavity, the wick structure is received in the cavity;
 wherein the first plate has a first surface and a second surface opposite to the first surface, the second plate has a bottom surface and a top surface opposite to the bottom surface, the bottom surface faces the second surface;
 wherein a portion of the first plate extends away from a plane of the leveled first plate to form a first extending portion, a portion of the second plate extends perpendicularly to the second plate to form a second extending portion, the first extending portion and the second extending portion are located on opposite sides of the cup portion;
 wherein the first extending portion is stamped from the first surface towards the second surface, and the second extending portion is stamped from the bottom surface towards the top surface;
 wherein the first extending portion and the second extending portion are hollow cylinders, the second plate defines a through hole corresponding to the first extending portion, the first extending portion extends into the through hole, an inner surface of the through hole contacts the first extending portion.

2. The airtight structure of claim 1, wherein an inner surface of the first extending portion defines a first screw thread.

3. The airtight structure of claim 1, wherein the first extending portion has a first top end, the first top end is above a bottom surface of the cup portion of the second plate.

4. The airtight structure of claim 1, wherein a middle portion of the cup portion is a flat board, a cross-section of the cup portion has a trapezoidal shape, a radius of the cup portion decreases with the change in distance away from the first plate.

5. The airtight structure of claim 2, wherein an inner surface of the second extending portion defines a second screw thread.

6. The airtight structure of claim 1, wherein the second extending portion has a second top end, the second top end is above a bottom surface of the cup portion.

7. The airtight structure of claim 1, wherein the wick structure includes a first portion mounted on the bottom surface of the second plate corresponding to the cup portion, a second portion mounted on the second surface of the first plate and a plurality of third portion connected between the first portion and the second portion.

8. The airtight structure of claim 7, wherein the plurality of third portion is perpendicular to the first portion and the second portion, every two adjacent third portion have equal spacing between.

9. The airtight structure of claim 7, wherein the first portion has a same thickness as a thickness of the second portion, a cross-section of the third portion has a rectangular shape.

10. The airtight structure of claim 9, wherein a thickness of the third portion is greater than the thickness of the first portion.

11. The airtight structure of claim 1, wherein the second plate is a bonding plate and has a uniform thickness, the second plate is made of the same materials as the first plate.

* * * * *